US010036788B2

(12) United States Patent
Calvert

(10) Patent No.: US 10,036,788 B2
(45) Date of Patent: Jul. 31, 2018

(54) FORCE-COMPENSATED GRADIENT COIL

(71) Applicant: Simon James Calvert, Oxfordshire (GB)

(72) Inventor: Simon James Calvert, Oxfordshire (GB)

(73) Assignee: Siemens Healthcare Limited, Camberley (GB)

( * ) Notice: Subject to any disclaimer, the term of this patent is extended or adjusted under 35 U.S.C. 154(b) by 1095 days.

(21) Appl. No.: 14/352,771

(22) PCT Filed: Nov. 19, 2012

(86) PCT No.: PCT/EP2012/073015
§ 371 (c)(1),
(2) Date: Apr. 18, 2014

(87) PCT Pub. No.: WO2013/079347
PCT Pub. Date: Jun. 6, 2013

(65) Prior Publication Data
US 2014/0274721 A1    Sep. 18, 2014

(30) Foreign Application Priority Data

Dec. 1, 2011 (GB) .................................. 1120652.1

(51) Int. Cl.
*G01R 33/3815*    (2006.01)
*G01R 33/385*    (2006.01)
(52) U.S. Cl.
CPC ..... *G01R 33/3815* (2013.01); *G01R 33/3854* (2013.01)

(58) Field of Classification Search
CPC ............ G01R 33/3815; G01R 33/3854; G01R 33/385; G01R 33/3858; G01R 33/3802
USPC ............................................. 324/318-320, 322
See application file for complete search history.

(56) References Cited

U.S. PATENT DOCUMENTS

| 5,331,281 | A |   | 7/1994 | Otsuka |              |
|-----------|---|---|--------|--------|--------------|
| 5,345,177 | A | * | 9/1994 | Sato   | G01R 33/3854 |
|           |   |   |        |        | 324/318      |
| 5,617,026 | A | * | 4/1997 | Yoshino | F16F 15/005 |
|           |   |   |        |        | 324/318      |
| 6,054,854 | A | * | 4/2000 | Kawamoto | G01R 33/381 |
|           |   |   |        |        | 324/318      |
| 6,353,319 | B1 | * | 3/2002 | Dietz  | G01R 33/3854 |
|           |   |   |        |        | 324/318      |

(Continued)

FOREIGN PATENT DOCUMENTS

GB   2462626      2/2010
WO   2010071921   7/2010

*Primary Examiner* — Rishi Patel
(74) *Attorney, Agent, or Firm* — Schiff Hardin LLP

(57) ABSTRACT

A cylindrical superconducting magnet system for use in magnetic resonance imaging has axially aligned primary superconducting coils that are situated within an outer vacuum chamber (OVC). A thermal radiation shield surrounds the primary superconducting coils within the OVC. A primary gradient coil assembly is axially aligned with the primary superconducting coils and is situated radially within the primary superconducting coils. The cylindrical superconducting magnetic system also includes a secondary gradient coil assembly, that is radially situated outside of the primary superconducting coils and that is mechanically attached to the primary gradient coil assembly.

14 Claims, 7 Drawing Sheets

(56) References Cited

U.S. PATENT DOCUMENTS

| | | | | |
|---|---|---|---|---|
| 6,552,543 B1 * | 4/2003 | Dietz | ............... | G01R 33/3854 |
| | | | | 324/318 |
| 6,954,068 B1 * | 10/2005 | Takamori | ........... | G01R 33/3854 |
| | | | | 324/318 |
| 7,053,744 B2 * | 5/2006 | Arz | .................. | G01R 33/3854 |
| | | | | 324/318 |
| 7,755,358 B2 * | 7/2010 | Dietz | ................. | G01R 33/288 |
| | | | | 324/319 |
| 2007/0069730 A1 | 3/2007 | Kimmlingen | | |
| 2007/0085542 A1 | 4/2007 | Ham | | |
| 2007/0236218 A1 * | 10/2007 | Liu | .................. | G01R 33/3856 |
| | | | | 324/318 |

* cited by examiner

FORCE-COMPENSATED GRADIENT COIL

BACKGROUND OF THE INVENTION

Field of the Invention

The present invention relates to cylindrical magnet systems as used in imaging systems such as MRI (Magnetic Resonance Imaging) systems.

Description of the Prior Art

FIG. 1 shows a radial cross-section through a typical magnet system for use in an imaging system. A cylindrical magnet 10, typically comprising superconducting coils mounted on a former or other mechanical support structure, is positioned within a cryostat, having a cryogen vessel 12, thermal radiation shield 16 and outer vacuum container (OVC) 14. The cryogen vessel 12 contains a quantity of liquid cryogen 15, for example helium, which holds the superconducting magnet at a temperature below its transition temperature.

The magnet is essentially rotationally symmetrical about axis A-A. The term "axial" is used in the present document to indicate a direction parallel to axis A-A, while the term "radial" means a direction perpendicular to axis A-A and passing through that axis. The cryogen vessel 12 is itself cylindrical, having an outer cylindrical wall 12a, an inner cylindrical bore tube 12b, and substantially planar annular end caps (not visible in FIG. 1). An outer vacuum container (OVC) 14 surrounds the cryogen vessel. It also is itself cylindrical, having an outer cylindrical wall 14a, an inner cylindrical bore tube 14b, and substantially planar annular end caps (not visible in FIG. 1). A hard vacuum is provided in the volume between the OVC 12 and the cryogen vessel 14, providing effective thermal insulation. A thermal radiation shield 16 is placed in the evacuated volume. This is typically not a fully closed vessel, but is essentially cylindrical, having an outer cylindrical wall 16a, an inner cylindrical bore tube 16b, and substantially planar annular end caps (not visible in FIG. 1). The thermal radiation shield 16 serves to intercept radiated heat from the OVC 14 before it reaches the cryogen vessel 12. The thermal radiation shield 16 is cooled, for example by an active cryogenic refrigerator 17, or by escaping cryogen vapor.

In alternative arrangements, the magnet is not housed within a cryogen vessel, but is cooled in some other way: either by a low cryogen inventory arrangement such as a cooling loop, or a 'dry' arrangement in which a cryogenic refrigerator is thermally linked to the magnet by solid thermal conduction. In such arrangements, there is no cryogen reservoir to absorb heat generated by ohmic heating of various conductive components by eddy currents.

The OVC bore tube 14b must be mechanically strong and vacuum tight, to withstand vacuum loading both radially and axially. Conventionally, it made of stainless steel. The cryogen vessel bore tube 12b, if any, must be strong and capable of withstanding the pressure of cryogen gas within the cryogen vessel. Typically, this is also of stainless steel. The bore tube 16b of the thermal radiation shield 16 must be impervious to infra-red radiation. It is preferably lightweight. It is typically made of aluminum.

The present invention may be applied in all such cases.

In order to provide an imaging capability, a set of gradient coils 20 are provided within the bore of the superconducting magnet. These are usually arranged as a hollow cylindrical, resin-impregnated block, containing coils which generate orthogonal oscillating magnetic field gradients in three dimensions.

During an imaging procedure, the gradient coils 20 generate rapidly oscillating magnetic fields, for example at a frequency of about 1500 Hz-2500 Hz. Stray fields from the gradient coils generate eddy currents in the closest conductive surface, typically a bore tube 14b, of the OVC. As described below, this can in turn lead to induced eddy currents on other conductive surfaces, such as metal parts of the cryostat, in particular in metal bore tubes 16b, 12b of thermal shield and cryogen vessel, and also in the structure of the magnet 10. The eddy currents produced in the material of the OVC 14 will help to shield the thermal radiation shield 16 and cryogenically cooled components such as cryogen vessel bore tube 12b, magnet coils and magnet former 10 from stray fields from the gradient coils 20. However, because of the constant background magnetic field produced by the magnet, those eddy currents produce Lorentz forces, resulting in mechanical vibrations in the bore tube of the OVC. Further mechanical vibrations result from mechanical vibration of the gradient coil assembly itself, caused by Lorentz forces acting on the conductors of the gradient coil assembly 20 which carry significant alternating currents. Mechanical vibration of the gradient coil assembly also causes noise by direct vibration of air within the bore.

These bore-tube mechanical vibrations, in the constant background magnetic field of the magnet 10, will in turn induce secondary eddy currents in conductive materials, such as the bore tube 16b of the thermal radiation shield. The secondary eddy currents will of course generate magnetic fields, known as secondary magnetic fields. These may interfere with imaging, and produce mechanical vibrations and secondary stray fields in that region. The secondary stray fields also induce tertiary eddy currents in nearby conductive surfaces. These tertiary eddy currents will, in turn, generate tertiary magnetic fields, and so on. By this mechanism, a substantial amount of energy may be transferred from the gradient coil to the cold structure of the magnet, despite several layers of shielding. This can result in significant cryogen loss in conventional magnets, and quenching in types of magnets with little or no cryogen inventory, such as the so-called "dry" magnets discussed above.

The bore tube 16b of the thermal radiation shield 16 is preferably thermally and electrically conductive to provide electromagnetic shielding of the magnet from the gradient coils in addition to its function of providing a cold surface and blocking infrared radiation from the OVC 14 the cryogen vessel 12 or the magnet structure 10.

A particular difficulty arises when, as is typical, the frequency of oscillation of the gradient magnetic fields is close to the resonant frequency of the bore tubes 12b, 14b, 16b. It is known that a number of concentric tubes of similar diameters, such as the bore tubes of the OVC, thermal radiation shield and cryogen vessel of a typical MRI system, have similar effective resonant frequencies when made from the usually-employed materials such as steel or aluminum.

The mechanical vibrations will be particularly strong when a resonant vibration frequency of a bore tube corresponds to the frequency of oscillation of the stray field. If the resonant frequencies of the OVC, thermal shield, cryogen vessel if any, and magnet components are close together, as is typically the case in present magnets, the bore tubes behave as a chain of closely coupled oscillators, and resonance bands will occur.

The oscillations may also interfere with the imaging process, causing detriment to the resulting images.

The resulting oscillations cause acoustic noise which is most unpleasant for a patient in the bore, as well as interfering with imaging and causing heating of cooled components such as the thermal radiation shield and cryogen vessel, if any.

The eddy currents induced in the cryogenically cooled components of the magnet constitute an ohmic heat load on the cryogenic cooling system, leading to an increased consumption of liquid cryogen where used, or an increased heat load on the cryogenic refrigerator. In dry magnets—those which are not cooled by a liquid cryogen—the increased heat load can result in a temperature rise of the coils, which can result in a quench.

Known approaches to this problem include the following. The gradient coil assembly may be mounted to the OVC bore tube 14*b* using resilient mounts, wedges or air bags. These are intended to attenuate the mechanical oscillations of the gradient coil assembly. However, such arrangements do not completely prevent mechanical transmission of vibrations from the gradient coil to the OVC, and do nothing to reduce the incidence of eddy currents in adjacent electrically conductive structures. It has been suggested to mount the gradient coil on to end frames, rather than to the OVC bore tube. However, such arrangements have required a lengthening of the system, which some embodiments of the present invention seek to avoid. Mechanical stiffening of the gradient coil assembly has been attempted. However, it is believed that a doubling of the stiffness of the gradient coil assembly will only result in an approximately 1.4× increase in the resonant frequency. Active force feedback actuators are suggested in U.S. Pat. No. 6,552,543, where actuators are placed within the OVC to oppose vibrations caused by stray fields from gradient coils. This solution is considered complex, and difficult to position the actuators between other components such as the magnet coils. It would be difficult to correctly synchronize the force feedback actuators with the oscillations induced by the gradient coils. Mode-compensated gradient coils have been suggested, in which primary and secondary conductors of the gradient coil assembly itself are optimized to reduce the amplitude of vibration of the gradient coil assembly. However, such optimization has been found to increase the stray field of the gradient coil assembly, resulting in increased heating of cryogenically cooled components due to eddy current generation.

Known approaches to similar problems have been described in the following publications.

U.S. Pat. No. 6,552,543 B1 discloses the use of mountings, including active mounts, between the gradient coil assembly and the cryostat.

U.S. Pat. No. 5,345,177 B2 this discloses the use of radial-spoke gradient coil mountings incorporating soft pads.

U.S. Pat. No. 6,353,319 B1 discloses mounting the gradient coil in the magnet bore, at points of maximum amplitude of mechanical vibrations, to disrupt resonant modes.

U.S. Pat. No. 7,053,744 B2 discloses a vacuum enclosure for the gradient coil.

U.S. Pat. No. 5,617,026 discloses the use of Piezo-transducers as a means of reducing the amplitude of gradient vibrations.

DE 10 2007 025 096 A1 discloses a method of mode-compensation of a gradient coil.

U.S. Pat. No. 6,954,068 teaches placing the gradient coil within an evacuated, electrically non-conductive vessel to reduce noise and vibration.

SUMMARY OF THE INVENTION

An object of the present invention is to reduce the oscillation of bore tubes subjected to oscillating gradient coil magnetic fields, by providing a secondary gradient coil assembly, positioned radially outside of a primary gradient coil assembly, superconducting magnet coils and the OVC and thermal radiation shield.

Preferably, cross-tubes are provided linking radially inner and radially outer surfaces of the OVC and thermal radiation shield, which substantially increases the stiffness of the OVC or thermal radiation shield, as appropriate. This increased stiffness in turn reduces the tendency of the OVC or thermal radiation shield to mechanically oscillate, and for eddy currents to be induced in the surfaces of the OVC or thermal radiation shield.

In preferred embodiments, currents are arranged to flow in the same direction in both the primary and secondary gradient coil assemblies, so that the forces generated by eddy currents induced by each gradient coil assembly essentially cancel out. The primary and secondary gradient coil assemblies are mechanically joined together, and this mechanical joining provides increased mechanical stiffness of the primary gradient coil assembly, raising its resonant frequency above that of the OVC and thermal radiation shield bore tubes. The magnetic field of the primary gradient coil assembly is partially cancelled by the magnetic field of the second gradient coil assembly. The magnetic fields of the primary and secondary gradient coil assemblies partially cancel each other out, meaning that any residual mechanical vibration of the bore tubes generates very little induced eddy current. When energized in the same direction, the primary and secondary coils induce eddy currents in the inner and outer conducting surfaces respectively. This allows the force on the shield or other conducting structure to be cancelled or reduced. In addition, the cross linking of the inner and outer tubes increases their resonant frequencies and stiffness.

Accordingly, the present invention provides a method and an apparatus as defined in the appended claims.

DESCRIPTION OF THE PREFERRED EMBODIMENTS

Figure 1:
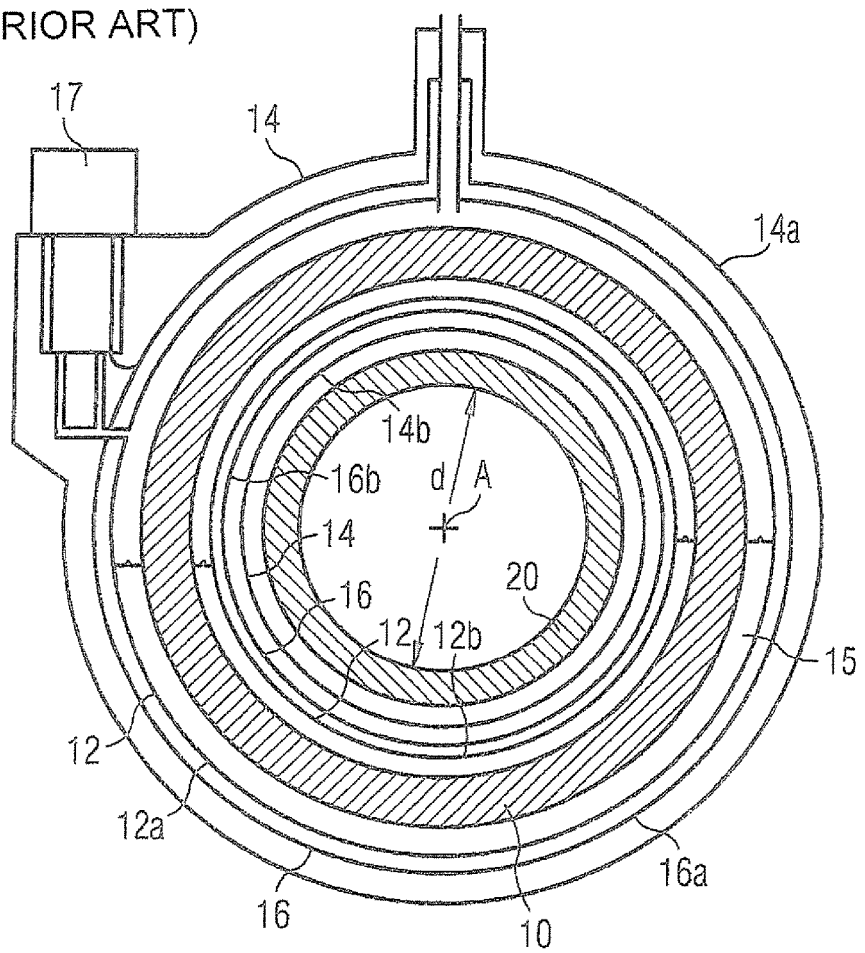
FIG. 1 shows a radial cross-section of a typical magnet system for use in an imaging system.

The present invention provides arrangements in which mechanical vibration of the gradient coil and bore tubes, and gradient coil induced heating (GCIH) resulting from operation of the gradient coil are significantly reduced. Significantly, the present invention allows the reduction in mechanical vibration and GCIH to be achieved without reducing the available radial diameter of the bore of the gradient coil assembly, without increasing the diameter of superconducting coils and without increasing the length of the magnet system.

The present invention provides a method for mechanically compensating for, or balancing, forces generated due to gradient coil-induced eddy currents in conductive structures such as the OVC and thermal radiation shield bore tubes. According to the present invention, this may be achieved by providing a secondary gradient coil radially outside the primary gradient coil, the thermal radiation shield bore tube and the OVC bore tube, which generates magnetic fields opposing those of the primary gradient coil in the region of the bore tubes, thereby reducing forces on the thermal radiation shield and the OVC, and so reducing the resultant acoustic noise and heating of the thermal radiation shield or other cryogenically cooled components.

The axial ends of the cryostat are most susceptible to stray magnetic gradient fields. In some embodiments, the secondary gradient coils and the associated force compensation is provided only near axial ends of the cryostat.

It is important to keep the bore diameter d of the gradient coils 20 as wide as possible, as that determines the useable diameter of the patient bore in a completed imaging system. Reduction in the diameter of the patient bore would result in reduced comfort for the patient, possibly resulting in spoilt imaging sequences, or patients being unable or unwilling to be imaged, due to the restricted volume available.

It is important to keep the axial length of the magnet system as short as possible, as an increase in length may increase or induce feelings of claustrophobia in patients, which may spoil imaging sequences, or cause patients to refuse to be imaged. Shorter magnets also require less space during transport and on site at the user's premises.

According to the present invention, a combination of features allows the objects of the invention to be achieved.

The gradient coil structure is mechanically isolated from the cryostat structure to avoid mechanical excitation of vibrations in the OVC. In preferred embodiments of the present invention, the gradient coil is supported directly on the floor, having no contact with the cryostat structure.

Those parts of the OVC that are most subject to gradient coil stray fields—typically near the bore tube ends—may be stiffened or made of an electrically non-conductive material to reduce or eliminate the effects of eddy currents and secondary stray fields.

According to a feature of the present invention, a secondary (compensating) gradient coil assembly is provided, radially outside of the primary gradient coil assembly, primary superconducting coils, thermal radiation shield and OVC.

The primary and secondary gradient coil assemblies are accordingly arranged radially either side of the primary superconducting coils. They interact to reduce the magnitude of gradient magnetic field experiences by the OVC and thermal radiation shield bore tubes. In some embodiments, the OVC and thermal radiation shield are provided with cross-tubes linking radially inner and radially outer surfaces, which significantly improves the stiffness of the OVC or thermal radiation shield.

Lorentz forces acting on the thermal radiation shield due to electrical currents flowing in the primary gradient coil assembly in a background magnetic field are balanced by compensating effect of currents flowing in the secondary gradient coil assembly.

In some embodiments of the present invention, the gradient coil assembly, or at least a part of it, is enclosed within the OVC, to prevent transmission of acoustic noise from the gradient coil assembly.

Figure 2:
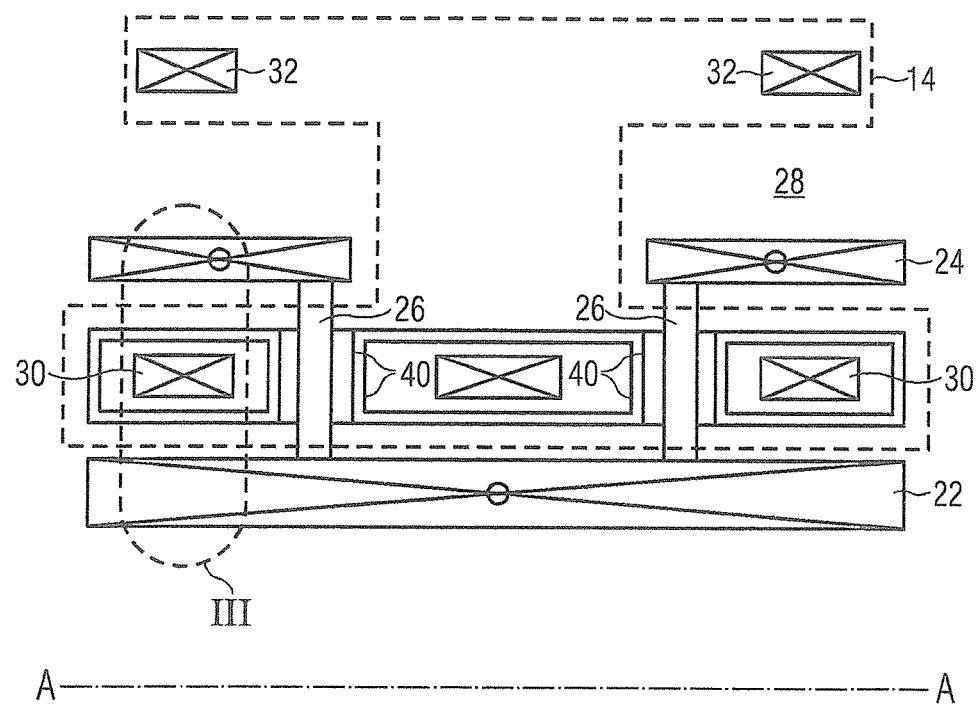
FIGS. 2-7 show schematic partial cross-sectional views of embodiments of the present invention.

FIG. 2 schematically illustrates a partial axial cross-section of a general gradient coil, thermal radiation shield and OVC assembly according to an explanatory embodiment of the present invention, that includes a primary gradient coil assembly 22 and a secondary gradient coil assembly 24.

In this arrangement, OVC 14, shown dotted in the drawing, has an annular re-entrant portion 28 in each annular end cap. This re-entrant portion may usefully increase the stiffness of the end-cap, reducing its tendency to vibrate during imaging operations. The secondary gradient coils 24 are located within this re-entrant portion. Such cryostats are discussed in co-pending UK patent applications GB1102154.0, GB1115464.8 and GB1016290.7

The structure of FIG. 2 is essentially rotationally symmetrical about axis A-A. The gradient coil assemblies 22, 24 are firmly mechanically linked 26 together, but are not mechanically linked to the remainder of the structure. Secondary gradient coil assembly 24, in this example, comprises two coils, each positioned radially outside the primary gradient coil assembly 22, the thermal radiation shield 16 and the OVC 14 near axial ends thereof.

The superconducting magnet comprises primary superconducting coils 30, positioned within the OVC, radially inside the re-entrant portion 28 and shield coils 32 positioned within the OVC, radially outside the re-entrant portion 28. The shield coils 32 and primary superconducting coils 30 are mechanically supported and joined in any appropriate manner. The manner of mechanical support and joining of the primary coils and shield coils does not form part of the present invention.

In the embodiment of FIG. 2, mechanical attachments 26 linking the primary gradient coil assembly 22 to the secondary gradient coils 24 pass though through-holes through the OVC, thermal radiation shield and any structure supporting and joining the primary superconducting coils 30 and the shield coils 32.

The through-holes in the OVC and thermal radiation shield must of course be sealed with cross-tubes 40. These cross-tubes greatly increase the stiffness of the OVC and thermal radiation shield, as appropriate. While some vibration of radially outer and radially inner surfaces of the OVC or thermal radiation shield may still take place, the stiffness added by the cross-tubes will significantly limit the magnitude of vibration. In some embodiments, it may be found that the additional stiffness introduced by the presence of these cross-tubes 40 enables thinner materials to be used for the OVC and thermal shield, possibly enabling the diameter of the bore of the magnet, and so also the inner diameter d of the gradient coil assembly, to be increased.

In certain embodiments, shielded gradient coils may be used, as further explained below. Use of shielded gradient coils reduces the gradient field experienced at the innermost conductive bore tube and allows higher power gradient coils to be used. Gradient coils could be unshielded, but these may cause relatively high spikes of current induced in bore tubes.

Figure 3:
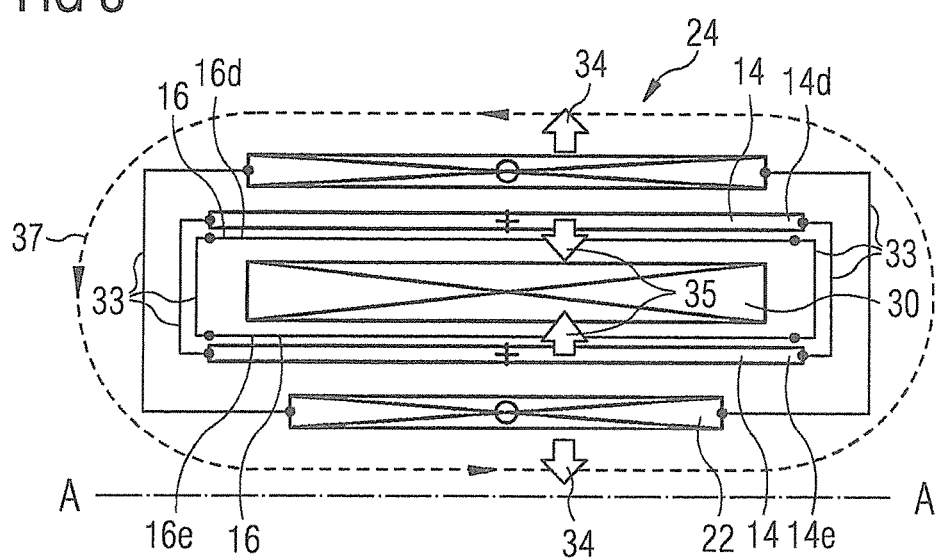

FIG. 3 schematically illustrates interactions between the described elements, according to a general principle of the invention, as shown in the part of FIG. 2 which is labelled III. The solid lines 33 linking OVC sections 14 and linking primary gradient coil assembly section 22 with secondary gradient coil section 24 represent the rigid mechanical linking of these parts respectively together.

In the illustrated arrangement, the current in the primary gradient coil 22 flows in the same direction as the current in the secondary gradient coil 24: in this case, in the direction toward the reader, out of the plane of the drawing. This may be achieved by connecting the primary gradient coil 22 and the secondary gradient coil 24 electrically in series. This has the advantage that magnetic fields respectively generated by primary and secondary gradient coils are perfectly synchronized.

During imaging, the currents in the gradient coils are rapidly pulsed. The accompanying rapidly varying magnetic fields induce eddy currents in the material of the OVC 14 and the thermal radiation shield 16. Such eddy currents are illustrated by cross symbols in FIG. 3, representing current flow into the plane of the drawing—the opposite direction from the flow of the gradient coil current which produces them, which is represented by "dot" symbols on the gradient coils. These eddy currents, flowing in the background magnetic field of the superconducting coils 30, cause Lorentz forces to act on the material of the OVC 14 and thermal shield 16.

The single field line 37 schematically illustrates the overall magnetic field generated by the gradient coil assembly of the present invention comprising both primary gradient coils 22 and secondary gradient coils 24. As may be observed, in this example, the secondary gradient coil 24 experiences an overall magnetic field 37 acting towards the left, in the drawing. This, combined with the direction of the electric current through the coil, causes a Lorentz force 34 on the secondary gradient coil 24 to act radially away from the axis A-A. Conversely, in this example, the primary gradient coil 22 experiences an overall magnetic field 37 acting towards the right, in the drawing. This, combined with the direction of the electric current through the coil, causes a Lorentz force 34 on the primary gradient coil assembly to act radially towards the axis A-A.

The effect of this is to generate forces 34 which urge the primary and secondary gradient coils away from one another: the primary gradient coil 22 is urged radially inward, while the secondary gradient coil 24 is urged radially outward. The rigid mechanical linking 33 between primary gradient coil assembly and secondary gradient coil resists these forces, which thereby cancel out, viewing the gradient coil assembly of the present invention as a whole. There is therefore a much reduced tendency for the gradient coils to vibrate.

The forces 35 urge radially inner and radially outer parts of the OVC 14 towards one another: the outer part 14d inward, while the radially inner part 14e is urged radially outward, due to the opposing directions of magnetic field experienced by the two parts. The rigid mechanical linking 33 between radially outer and radially inner parts of the OVC resists these forces, which thereby cancel out, viewing the OVC as a whole. The rigid mechanical linking represented at 33 is provided by cross-tubes 40 shown in other figures. The cross-tubes 40 are placed under tension and compression by the oscillating forces caused by the gradient magnetic field, but the overall force acting on the OVC is approximately zero, as the forces on the outer surface 14d approximately cancel the forces on the inner surface 14e.

As for the thermal radiation shield, the forces 35 urge radially inner and radially outer parts of the thermal radiation shield 16 in opposite directions, due to the opposing directions of magnetic field experienced by the two parts 16d, 16e. The rigid mechanical linking 33 between radially outer and radially inner parts of the thermal radiation shield resists these forces, which thereby cancel out, viewing the thermal radiation shield as a whole. The rigid mechanical linking represented in FIG. 3 at reference numeral 33 is provided by cross-tubes 40 as shown in other figures.

Each of the parts 14d, 14e, 16d, 16e experiences the magnetic fields of both the primary gradient coil assembly 22 and the secondary gradient coil 24. These will cancel out to some extent, reducing the field strength of the gradient field experienced by parts 14d, 14e, 16d, 16e and reducing the magnitude of any currents induced in them.

The cross-tubes 40 provided through the OVC and/or thermal radiation shield makes the respective vessel very stiff and resistant to mechanical oscillation. Although parts of each surface of each vessel, away from the cross-tubes, may be caused to mechanically oscillate, the overall stiffness of each vessel means that any such oscillations are of very small amplitude.

As the currents in the gradient coil will oscillate, the eddy currents in the OVC and thermal radiation shield will similarly oscillate, but the direction of currents shown in FIG. 3 illustrates a selected instant in time.

The illustrated example, where the primary gradient coil assembly 22 includes a single solenoid, and using a simple solenoid coil 24 as the secondary gradient coil, is a simplification for explanation purposes only, but a similar arrangement may be used to balance the Lorentz forces and to reduce gradient coil induced heating of rather more complex gradient coil assemblies. The secondary gradient coil 24 will need to be correspondingly more complex. For example, a typical gradient coil assembly generates oscillating magnetic field gradients in three orthogonal directions, typically referred to as x, y, z. While gradient fields may be provided in the z-direction with simple annular coils such as discussed above, gradient fields in the x- and y-directions require saddle coils, and the secondary gradient coils of the present invention will similarly require saddle coils to provide the correct oscillating magnetic field to compensate for forces on the thermal radiation shield and OVC caused by the primary gradient coils. However, the principle of the present invention, discussed above, remains the same for all such arrangements.

Some gradient coil assemblies include gradient shield coils, which are provided to reduce the stray magnetic fields reaching the OVC, or extending into the vicinity of the magnet, from the gradient coil assembly.

The present invention may also be applied to such shielded primary gradient coil assemblies, and the shielding effect may be incorporated at least partly into the secondary gradient coils 24, using a suitable conventional modelling method for designing the primary and secondary gradient coils.

The Lorentz forces within the gradient coil assembly should be, as far as is possible, balanced so that the gradient coil structure is not subject to body loads which would tend to cause large amplitude vibrations. This is achieved by suitable design of primary and secondary gradient coils, and the mechanical support 26 linking them together.

Figure 4:
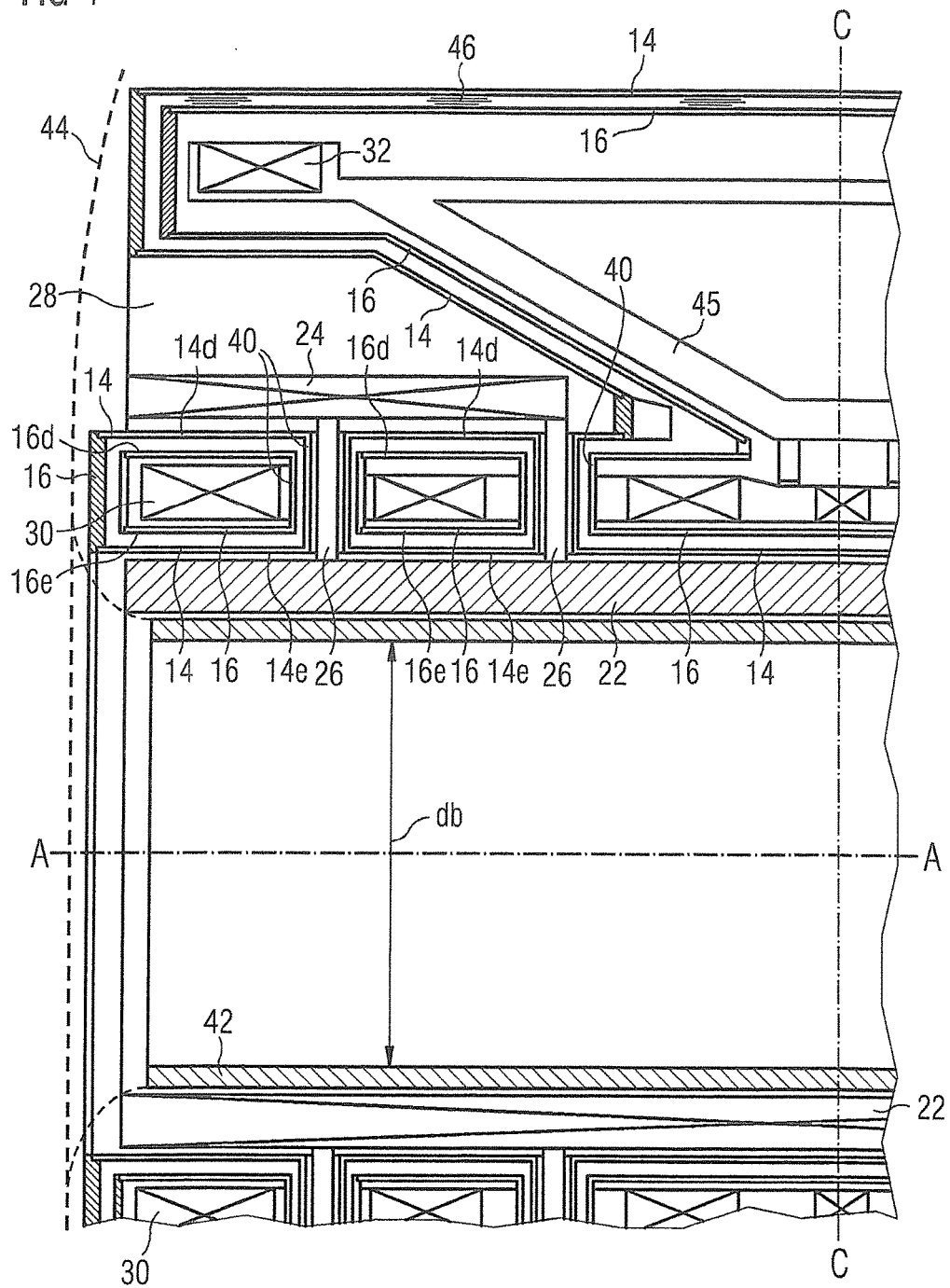

FIG. 4 shows a more complete partial axial cross-section of an embodiment of the present invention resembling the examples shown in FIGS. 2-3. The structure in FIG. 4 is essentially rotationally symmetrical about axis A-A, and essentially has reflectional symmetry about the center plane marked C-C. Looks covers, shown dotted at 44, are used to cover the ends of the magnet system, and present an aesthetically pleasing, easy-to-clean, outer surface. The support structure 45 of the superconducting shield coils 32 is such that a re-entrant portion may be provided in the end caps of the OVC 14, thermal radiation shield 16 and cryogen vessel, if any. Accordingly, an essentially annular cavity 28 is formed in the end caps of the OVC.

Cross-tubes 40 allow mechanical supports 26 to pass through the OVC 14 and the thermal radiation shield 16, while ensuring the functional integrity of both the OVC and the thermal radiation shield, yet avoiding any mechanical contact between the gradient coil assembly and the OVC. The cross-tubes 40 add significantly to the stiffness of the corresponding OVC or thermal radiation shield, significantly reducing its tendency to oacillate.

Coils 30 of the primary superconducting magnet are mechanically supported and retained in required fixed relative positions by any suitable arrangement which allows cross-tubes 40 to pass radially between coils.

Superconducting shield coils 32 are mechanically supported and retained in position radially outside the primary superconducting magnet 30 by any suitable arrangement 45 which allows the provision of a re-entrant portion 28 in the annular end caps of the OVC 14, sufficient for placement of secondary gradient coil assemblies 24.

FIG. 4 illustrates an example of a suitable mechanical support structure 45, but others may be employed as preferred, within the scope of the present invention.

A body coil 42 is provided, radially within the gradient coil assembly. The body coil 42, in use, provides an RF (radio-frequency) oscillating magnetic field, as required for magnetic resonance imaging. The inner diameter db of the body coil 42 defines the patient bore: the cavity into which a patient must enter to be imaged. It is desired that the advantages of the present invention should be achieved without the need to reduce the inner diameter db of the patient bore.

As illustrated in FIG. 4, the secondary gradient coil assembly 24 is positioned within the cavity 28. Mechanical supports 26 pass through cross-tubes 40 and link the primary gradient coil assembly 22 with the secondary gradient coil assembly 24. The secondary gradient coil assembly 24 is placed in a volume which is typically within the OVC, for a non-re-entrant OVC. The provision of secondary gradient coil assembly 24 and mechanical supports 26 does not reduce the available patient bore diameter db as compared to a similar magnet system with a conventional gradient coil arrangement.

The secondary gradient coil assembly 24 is used to cancel some of the gradient filed of the primary gradient coil assembly 22 in the region of the OVC and thermal radiation shields, and to induce eddy currents in the material of the OVC 16 and the thermal radiation shield 14 which oppose the eddy currents induced in those components by the primary gradient coil assembly 22, as discussed with reference to FIG. 3. Preferably, the secondary gradient coil assembly 24 induces eddy currents in the material of the radially outer parts of the OVC 16d and the thermal radiation shield 14d which have an equal and opposite effect as compared to the eddy currents induced in the radially inner parts of the OVC 16e and the thermal radiation shield 14e by the primary gradient coil assembly 22. The stiffness of the OVC and thermal radiation shield provided by cross-tubes 40 ensures a tolerable level of mechanical vibration.

Although not illustrated, conventional mechanical support arrangements may be provided to suspend the magnet assembly, the thermal radiation shield and the cryogen vessel, if any, within the OVC 14. Any suitable mechanical arrangement may be provided for supporting and retaining coils 30 of the primary superconducting magnet in position. Solid thermal insulation 46, for example aluminized polyester sheets, may be provided between the thermal radiation shield 16 and the OVC 14, as is conventional.

The presence of radially-directed cross-tubes 40 through parts of the OVC 14 and thermal radiation shield 16 which house the primary superconducting magnet significantly increase the stiffness of the OVC and thermal radiation shield. The added stiffness of OVC and thermal radiation shield reduce the amplitude of vibrations induced by eddy currents on the respective bore tubes, reducing the associated heating. The reduced amplitudes of vibration also reduce the amplitude of secondary eddy currents. The re-entrant end cap of the OVC reduces the magnitude of vibration of the end cap.

Figure 5:
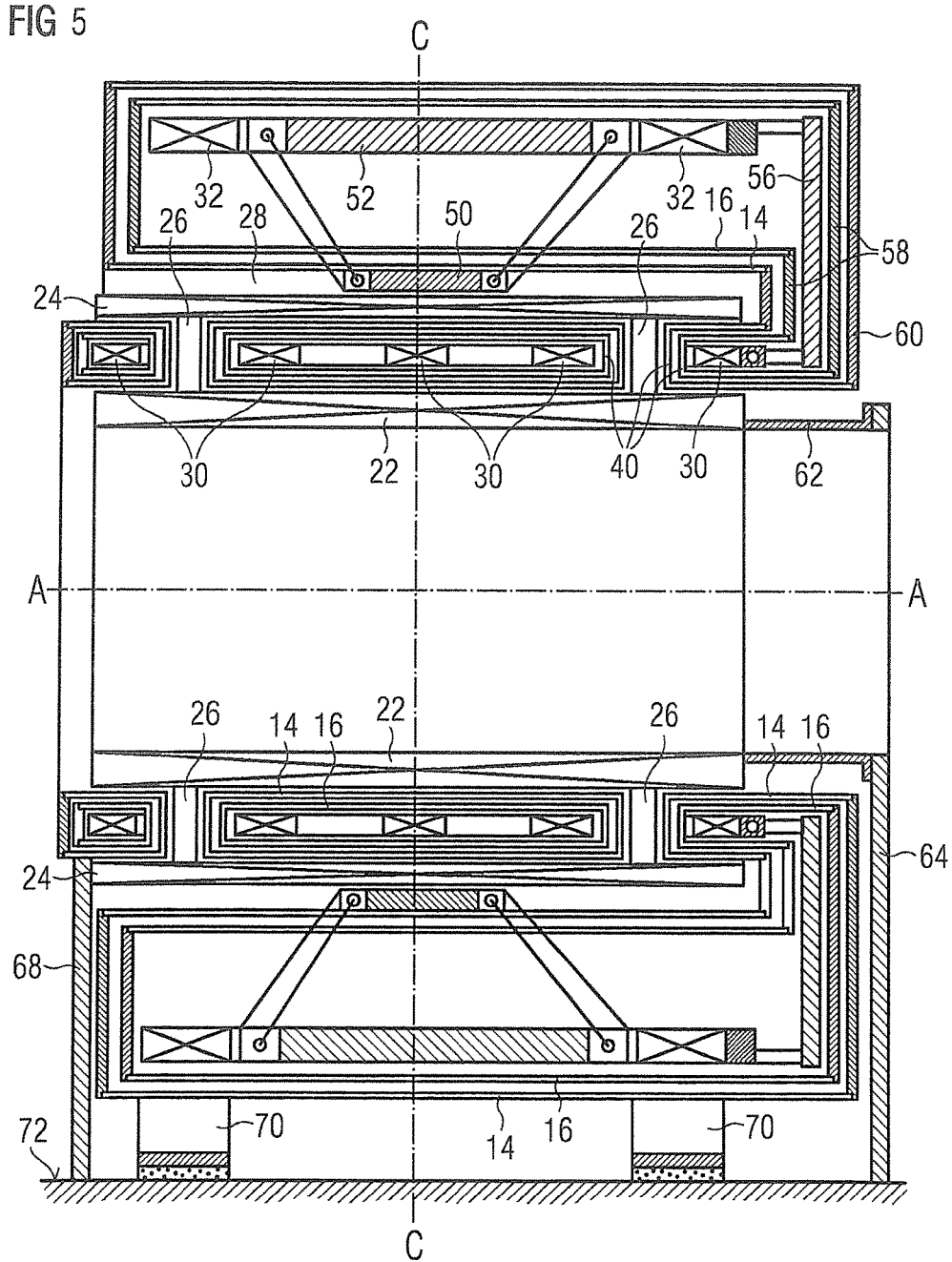

FIG. 5 illustrates a further embodiment of the present invention. In this embodiment, one OVC end cap is provided with a fully re-entrant portion, so that the annular recess 28 extends at least to the distal axial end of the secondary gradient coil assembly 24. Primary gradient coil assembly 22 is shown, in this case extending the length of the primary superconducting coil 30 assembly. Cross-tubes 40 are provided, similar to those shown in FIG. 4, which define through-holes through a part of the OVC 14 and thermal radiation shield 16 which houses the primary superconducting coils. The primary superconducting coils 30 are retained together and supported in such a way that the cross-tubes 40 may pass through the associated parts of the OVC and thermal radiation shield without touching the primary superconducting coil assembly.

Secondary gradient coil assembly 24 is provided within the recess 28. As the recess extends axially the length of the primary gradient coil assembly, a single secondary gradient coil assembly 24 may be provided, extending axially essentially the length of the primary gradient coil assembly, and mechanically attached 26 to the primary gradient coil assembly at at least two axial positions, either side of center line C-C, each preferably near an axial end of the primary gradient coil assembly 22. The gradient coil assembly in this embodiment accordingly comprises two coaxial cylindrical structures, primary gradient coil assembly 22 and secondary gradient coil assembly 24, rigidly connected together by mechanical supports 26. The resultant gradient coil assembly is very rigid, and the additional rigidity is provided without reduction in the available bore d of the gradient coil assembly. Furthermore, the secondary gradient coil assembly 24 is able to produce a magnetic field cancelling the effects of the magnetic field of the primary gradient coil assembly 22 along the whole axial length of the gradient coil assembly, not just near the axial ends, as was the case with the embodiments of FIGS. 2-4.

In the illustrated embodiment, due to the axial length of the cavity 28, the superconducting shield coils 32 are not directly mechanically supported on the primary superconducting coil assembly. Rather, an intermediate support piece 50 is provided, mechanically attached, and sealed to the OVC. This support piece is a strong annular structure, and the superconducting shield coils 32 are mounted on a mechanical support structure 52 which is supported on the support piece 50, itself supported on the OVC. At the axial end of the magnet structure away from the cavity 28, the superconducting shield coils 32 are mechanically connected to the primary magnet coils 30 by an annular magnet connection structure 56, at the operating temperature of the superconducting coils 30, 32. Annular parts 58 of the thermal radiation shield 16, and annular parts 60 of the OVC 14 enclose the annular magnet connection structure 56, and complete the thermal radiation shield and OVC respectively.

The gradient coil assembly is supported by an annular extension piece 62 which is attached to the primary gradient coil assembly 22 and extends axially out of the bore of the OVC. A ground support 64 supports the gradient coil assembly on a support surface 72, typically the ground, using the annular extension piece 62.

Alternatively, or in addition, a ground support 68 may support the gradient coil assembly on the support surface 72.

Feet 70 support the OVC on the support surface 72.

Figure 6:
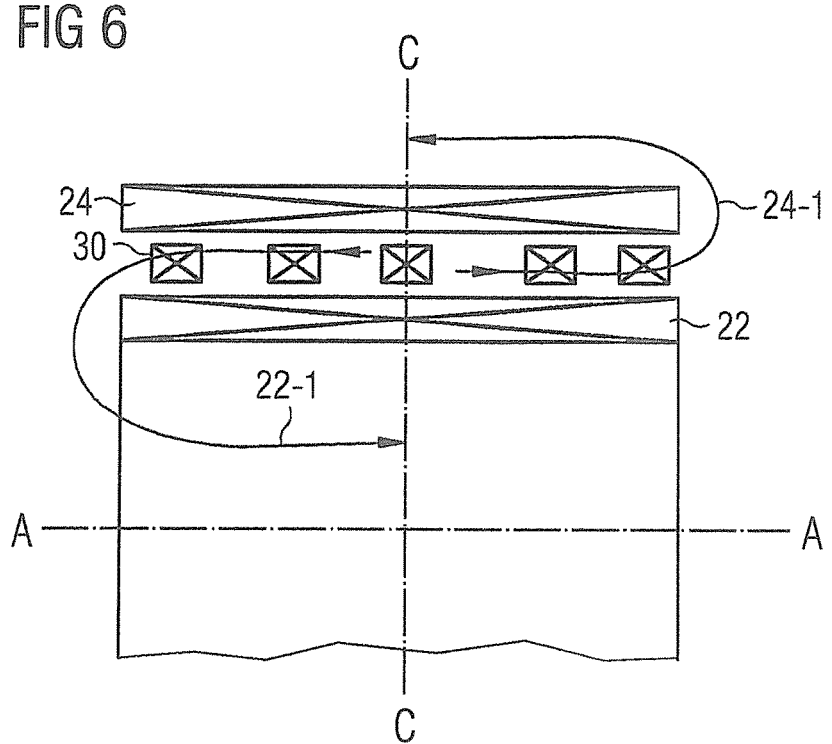

FIG. 6 schematically illustrates the magnetic effect of the first gradient coil assembly 22 and the second gradient coil assembly 24 in the arrangements of the present invention. In this simple example, each of the first and second gradient coil assemblies 22, 24 carries a current in a direction extending perpendicularly out of the plane of the drawing. In each case, a magnetic field is produced, having field lines directed anti-clockwise about the part cross-section of the coil shown in the drawing. A sample field line 22-1 generated by primary gradient coil assembly 22 is illustrated, along with a sample field line 24-1 generated by secondary gradient coil assembly 24. In the region of the primary superconducting coils 30, the field lines 22-1 and 24-1 are directed in opposite directions. This shows that, in the radial space between the primary gradient coil assembly 22 and the secondary gradient coil assembly 24, the magnetic fields of the primary gradient coil assembly 22 and the secondary gradient coil assembly 24 largely cancel out, meaning that the magnitude of eddy currents induced in the material of the OVC and the thermal radiation shield in that space is similarly much reduced. The gradient coil field within the bore is largely unaffected by the presence of the secondary gradient coils. Any effect can be compensated for during the design process for the primary and secondary gradient coils.

The reduced eddy currents lead to reduced vibrations due to Lorentz forces, and the stiffened OVC and thermal shields regions due to the presence of cross-tubes 40 further reduce vibration, which in turn leads to reduced secondary eddy currents induced in the material of the OVC and thermal shield due to their vibration on the magnetic field of the superconducting magnet. As discussed with reference to FIG. 3, the combination of primary gradient coil 22 and secondary gradient coil 24 have opposing effects on radially inner and radially outer parts of the OVC and thermal radiation shield, so any forces generated by eddy currents in those parts will produce a reduced mechanical vibration, and the opposing forces cancel out through the mechanical supports 26.

This embodiment is believed to provide a stiffer gradient coil assembly than embodiments such as shown in FIG. 4, where two separate secondary gradient coil assemblies are provided, towards opposite axial ends of the primary gradient coil assembly.

Figure 7:
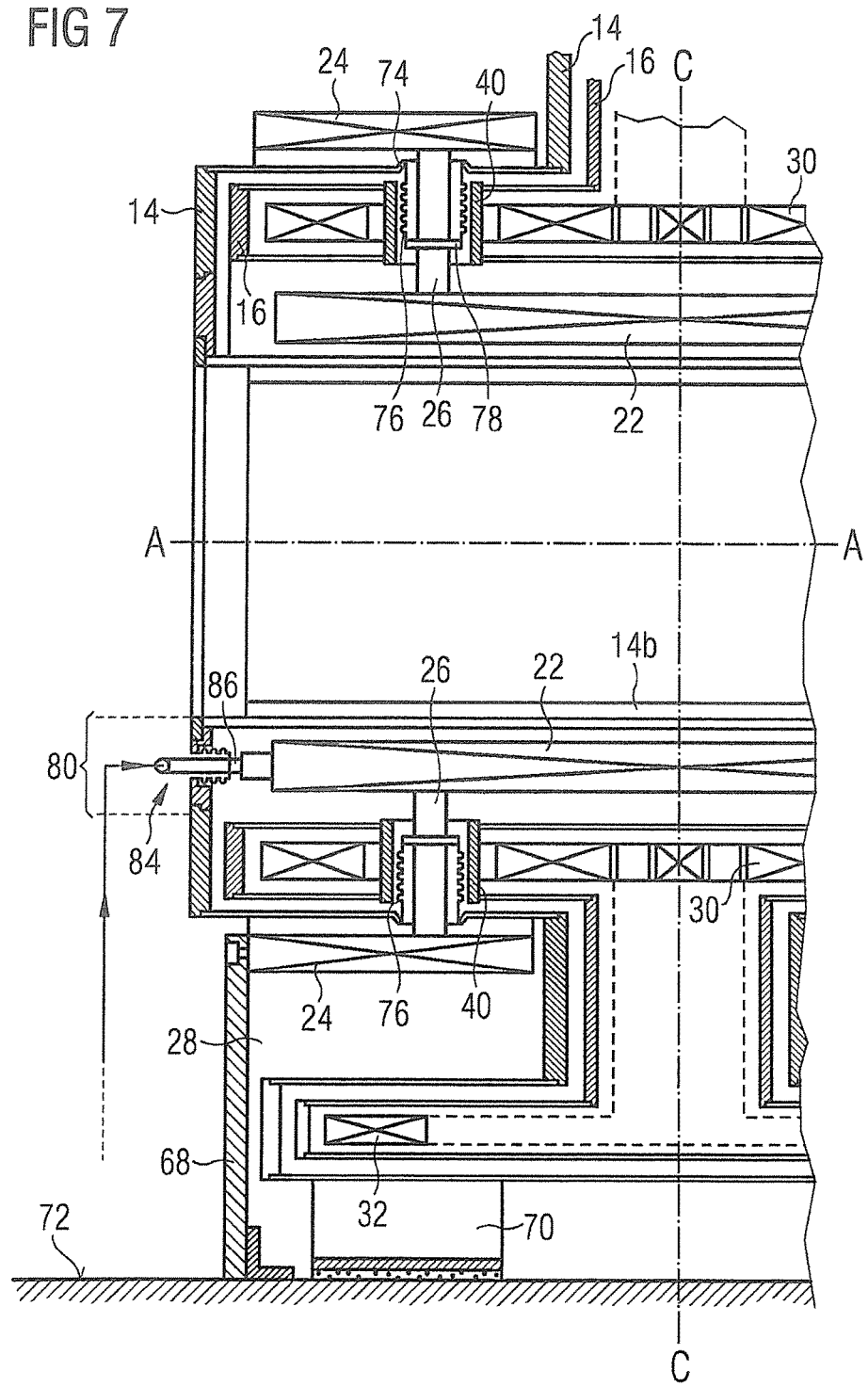

A further, preferred, embodiment of the present invention is shown in FIG. 7. In this embodiment, the primary gradient coil assembly 22 is positioned within the OVC 14, in the evacuated space between the OVC bore tube 14b and the thermal radiation shield bore tube 16b. By positioning the primary gradient coil assembly 22 in the vacuum space, no acoustic noise can propagate through the vacuum. Secondary gradient coil assembly 24 is positioned outside of the OVC, in the annular recess 28 described with reference to earlier embodiments.

Secondary gradient coil assembly 24 is supported on a support surface 72, typically the ground, by ground support 68. The primary gradient coil assembly 22 is mechanically supported by the secondary gradient coil assembly 24 through mechanical supports 26. In this embodiment, the mechanical supports pass through cross-tubes 40 within the thermal radiation shield, as in other embodiments described above. However, supports 26 must pass from outside the OVC, where they interface with the secondary gradient coil assembly 24, to within the OVC, where they interface with the primary magnet coil assembly 22. In the illustrated embodiment, this is arranged by providing holes 74 in the OVC surface between the primary gradient coil assembly, and the secondary coil assembly, and closing those holes with bellows arrangement 76, in this example closed by a closure member 78 sealed to the support 76. The bellows arrangement allows the OVC to remain vacuum-tight, while absorbing mechanical vibrations from the gradient coil assembly and ensuring that these mechanical vibrations are not applied to the OVC.

Preferably, a part 80 of the end cap of the OVC is removable, to allow placement and replacement of the primary gradient coil assembly 22. Of course, the part 80 can only be removed when the OVC is not evacuated. The presence of removable part 80 is of significant assistance when the OVC is being assembled around the primary superconducting coils 30. Preferably, in such arrangements, the OVC bore tube 14b is of an electrically non-conducting, non-magnetic material. An example of a suitable material is glass fiber impregnated with thermosetting resin. Such material does not suffer from eddy current generation, and is magnetically transparent so that is does not interfere with the gradient magnetic fields generated by the gradient coils. In such an arrangement, the OVC bore tube 14b will not suffer from Lorentz forces. Currents will however be induced in the bore tube 16b of the thermal radiation shield.

In order to provide the required electrical current to the gradient coil assembly, at least one current lead-through 84 is provided in the OVC, preferably in the removable part 80. The current lead-through is preferably connected to the OVC with a bellows 86 which serves to isolate the OVC from any mechanical vibration of the gradient coil assembly, while still enabling the OVC to remain vacuum-tight. The bellows may be closed by a closure member 78 sealed to the mechanical support 86.

The present invention accordingly provides gradient coil arrangements in an imaging system, in which oscillation of the OVC, thermal radiation shield, and cryogen vessel, are significantly reduced. This improves the resultant imaging and patient comfort.

According to the present invention, flexural stiffness of the gradient coil is increased by mechanically linking the conventional primary gradient coil assembly to a radially outer secondary gradient coil assembly 24 by mechanical supports 26. The resultant mechanical stiffening reduces the amplitude of any vibrations and increases the resonant frequencies of the gradient coil assembly towards values which are not excited by normal imaging sequences.

The gradient coil structure is mechanically isolated from the cryostat structure to avoid direct mechanical excitation of vibrations in the OVC. Preferably, the gradient coil assembly is mounted to a support surface independently of the cryostat structure. Examples of such structures are discussed above with reference to FIGS. 5 and 7.

The parts of the OVC and thermal radiation shield near the axial ends of the bore are preferably stiffened to reduce the amplitude of any vibration. This stiffening may be achieved by fitting of cross-tubes 40 as described above, which allow mechanical supports 26 to pass from the primary gradient coil assembly 22 to the secondary gradient coil assembly 24. The axial ends of the OVC and thermal radiation shields generally experience stronger stray magnetic fields from the gradient coil assembly.

These parts of the OVC may be made of a composite material such as glass fiber impregnated with thermosetting resin, to prevent eddy current generation in the material of the OVC.

Preferably, the objects of the present invention are achieved without increasing the length of the bore of the OVC or the gradient coil assembly of the system, and without reducing the diameter of the available patient volume. Indeed, due to the stiffening effect of the cross-tubes 40 of the OVC and thermal radiation shield, the thickness of the bore tube of the OVC and thermal radiation shield bore tube may be reduced, which may increase the diameter of the available patient volume.

The primary and secondary gradient coil assemblies 22, 24 are preferably operated such that the magnetic fields generated by them tend to cancel out in the region of the OVC and thermal radiation shield positioned radially between them. In this way, reduced eddy currents flow, reduced heating of the thermal radiation shield results, and less acoustic noise is generated within the bore. Furthermore, the forces which are generated on the regions of the OVC and thermal radiation shield positioned radially between the primary and secondary gradient coil assemblies are borne by mechanical supports 26 linking the radially inner and radially outer sections such that the forces at least substantially cancel out. This force-balancing, or partial force balancing, does not compromise any active shielding of the primary superconducting coils which may be conventionally provided.

Although modifications and changes may be suggested by those skilled in the art, it is the intention of the inventor to embody within the patent warranted heron all changes and modifications as reasonably and properly come within the scope of his contribution to the art.

I claim as my invention:

1. A cylindrical superconducting magnet system for use in magnetic resonance imaging, comprising:
    axially aligned primary superconducting coils, situated within an outer vacuum chamber (OVC);
    a thermal radiation shield surrounding the primary superconducting coils, within the OVC;
    a primary gradient coil assembly axially aligned with the primary superconducting coils and located radially within the primary superconducting coils, a secondary gradient coil assembly radially situated outside of the primary superconducting coil assembly and mechanically attached to the primary gradient coil assembly; and
    said primary gradient coil assembly comprising primary gradient coils and said second gradient coil assembly comprising secondary gradient coils, and said primary gradient coils and said second gradient coils being connected in series.

2. A cylindrical superconducting magnet system according to claim 1 wherein the OVC is supported on a support surface, and the primary and secondary gradient coil assemblies are supported on the support surface independently of the OVC.

3. A cylindrical superconducting magnet system according to claim 1, further comprising a cryogen vessel housing the primary superconducting coils, with the thermal radiation shield surrounding the cryogen vessel, within the OVC.

4. A cylindrical superconducting magnet system according to claim 1, wherein the OVC comprises a bore tube, an outer cylindrical wall and annular end pieces, wherein at least one of the end pieces has a re-entrant portion defining a recess, and the secondary gradient coil assembly is situated within the recess.

5. A cylindrical superconducting magnet system according to claim 4, wherein said secondary gradient coil assembly is a first secondary gradient coil assembly, and comprising a second secondary gradient coil assembly, and wherein each of said end pieces has a re-entrant portion defining a recess, and the first secondary gradient coil assembly is situated within the recess of one of said end pieces and the second secondary gradient coil assembly is situated in the recess of the other of said end pieces.

6. A cylindrical superconducting magnet system according to claim 5 wherein at least one secondary gradient coil assembly is mechanically attached to the primary gradient coil assembly by mechanical attachments that pass through through-holes proceeding through the OVC, and the thermal radiation shield.

7. A cylindrical superconducting magnet system according to claim 6, wherein the mechanical attachments pass between adjacent primary superconducting coils.

8. A cylindrical superconducting magnet system according to claim 6, wherein the through-holes in the OVC are sealed by radially-directed cross-tubes extending between a bore tube of the OVC and the recess, and in which the mechanical attachments pass through the cross-tubes.

9. A cylindrical superconducting magnet system according to claim 8, wherein the through-holes in the thermal radiation shield are sealed by radially-directed cross-tubes extending coaxially with the cross-tubes sealing the OVC.

10. A cylindrical superconducting magnet system according to any of claims 4-9, wherein:
    one of the end pieces of the OVC has a single recess extending axially along the length of the primary gradient coil assembly; and
    the secondary gradient coil assembly extends axially along a length of the primary gradient coil assembly, mechanically attached to the primary gradient coil assembly at at least two axial positions, either side of a center line.

11. A cylindrical superconducting magnet system according to claim 10, comprising superconducting shield coils, situated radially outside of the primary superconducting coils and the secondary gradient coil assembly, an intermediate support piece mechanically attached to and sealed to the OVC, and a mechanical support structure on which the superconducting shield coils are mounted, the mechanical support structure being supported on the intermediate support piece.

12. A cylindrical superconducting magnet system according to claim 11, comprising an annular magnet connection structure situated at the axial end of the magnet structure away from the recess, that mechanically connects the superconducting shield coils to the primary magnet coils with annular parts of the thermal radiation shield, and annular parts of the OVC enclosing the annular magnet connection structure and completing the thermal radiation shield and OVC respectively.

13. A cylindrical superconducting magnet system according to claim 1 wherein the OVC has bore tubes therein and wherein, in use, the secondary gradient coil assembly induces eddy currents in material of the bore tubes of the OVC and the thermal radiation shield that oppose eddy currents induced in said bore tubes by the primary gradient coil assembly.

14. A method for operating a cylindrical superconducting magnet system for magnetic resonance imaging, said cylindrical superconducting magnet system comprising axially aligned primary superconducting coils, situated within an outer vacuum chamber (OVC), a thermal radiation shield surrounding the primary superconducting coils, within the OVC, a primary gradient coil assembly axially aligned with the primary superconducting coils and located radially within the primary superconducting coils, a secondary gradient coil assembly radially situated outside of the primary superconducting coil assembly and mechanically attached to the primary gradient coil assembly, said method comprising:
    generating synchronized currents; and balancing forces acting on at least one of said OVC and said thermal radiation shield by causing said synchronized currents to flow in a same direction in each of said primary gradient coil assembly and said secondary gradient coil assembly.

* * * * *